United States Patent [19]

Clerc et al.

[11] Patent Number: 5,776,644
[45] Date of Patent: Jul. 7, 1998

[54] PHOTOLITHOGRAPHIC METHOD FOR HIGH RESOLUTION CIRCLE PATTERNING UTILIZING CALIBRATED OPAQUE MICROSPHERES

[75] Inventors: Jean-Frédéric Clerc, Saint Egreve; Denis Randet, Meylan, both of France

[73] Assignee: Commissariat a l'Energie Atomique, Paris Cedex, France

[21] Appl. No.: 551,914

[22] Filed: Oct. 23, 1995

[30] Foreign Application Priority Data

Oct. 24, 1994 [FR] France .................... 94 12925

[51] Int. Cl.$^6$ .................... G03C 5/00
[52] U.S. Cl. .................... 430/8; 430/5; 430/6; 430/324; 430/326; 430/327
[58] Field of Search .................... 430/5, 6, 8, 23, 430/24, 302, 324, 326, 327

[56] References Cited

U.S. PATENT DOCUMENTS 4,668,080  5/1987  Gale et al. .................... 355/51

FOREIGN PATENT DOCUMENTS

A360050  12/1982  Austria .
3821268  12/1989  Germany .
2253925  9/1992  United Kingdom .

OTHER PUBLICATIONS

Patent Abstracts of Japan, vol. 7, No. 30, p. 173, & JP-A-57 181549, 9 Nov. 1982.

Patent Abstracts of Japan, vol. 7, No. 75, p. 187, & JP-A-58 004148 1 Nov. 1983.

*Primary Examiner*—Christopher G. Young
*Attorney, Agent, or Firm*—Plevy & Associates

[57] ABSTRACT

A photolithographic method for patterning small diameter circles at a high resolution on a layer, comprises the steps of depositing a resist layer on said layer; depositing calibrated microspheres, opaque to a radiation, on the surface of the resist layer; and irradiating said resist layer with said radiation.

7 Claims, 6 Drawing Sheets

PHOTOLITHOGRAPHIC METHOD FOR HIGH RESOLUTION CIRCLE PATTERNING UTILIZING CALIBRATED OPAQUE MICROSPHERES

FIELD OF THE INVENTION

The present invention relates to a photolithographic method for circle patterning. It more particularly relates to a photolithographic method for etching small diameter circles in a layer which must be patterned at a high resolution.

STATE OF THE ART

Conventionally, photolithographic circle patterning consists in depositing a layer of photosensitive material, usually called photoresist, on the layer to pattern, irradiating this resist layer through a mask, and then etching. This technique can no longer be applied or is excessively expensive when it is desired to realize very small diameter high resolution circle patterns in large layers.

Such problems are encountered, for example, in the production of finely perforated membranes, of liquid crystal displays, or others.

The application of a photolithographic patterning method for producing microtips in a cathode of a flat display screen will be described in more detail as an example.

FIG. 1 shows the structure of a microtip flat screen. Such a microtip screen is essentially comprised of a cathode 1 with microtips 2 and of a grid 3 provided with holes 4 corresponding to the locations of the microtips 2. Cathode 1 faces a cathodoluminescent anode 5 having a glass substrate 6 which constitutes the surface of the screen.

The operating principle and the detail of the constitution of an exemplary microtip screen are described in U.S. Pat. No. 4,940,916 assigned to Commissariat a l'Energie Atomique. Cathode 1 is organized in columns and is comprised, on a glass substrate 10, of cathode conductors organized in an array from a conductive layer. The microtips 2 are realized on a resistive layer 11 deposited on the cathode conductors and are located in cells of the array defined by the cathode conductors. FIG. 1 partially shows a cell of the array, the cathode conductors not appearing in this figure. Cathode 1 is associated to grid 3 which is organized in rows. The intersection of a grid row 3 and of a cathode column 1 defines a pixel.

This device uses the electric field created between anode 5 and cathode 1 such that electrons are extracted from the microtips 2 towards a cathodoluminescent layer 7 of anode 5 under the control of grid 3. In the case of a color screen, such as shown in FIG. 1, anode 5 is provided with alternate strips of luminophore elements 7, corresponding each to a color (blue, red, green). The strips are separated from each other by a insulator 8. The luminophore elements 7 are deposited on electrodes 9, comprised of corresponding strips of a transparent conductive layer, such as indium-tin oxide (ITO). The groups of blue, red and green strips are alternately biased with respect to cathode 1 such that the electrons extracted from the microtips 2 of a pixel of the cathode/grid are alternately directed towards the luminophore elements 7 facing each color.

FIGS. 2A to 2D illustrate an example of an arrangement of this type, wherein FIGS. 2B and 2D are respectively enlargements of parts of FIGS. 2A and 2C. Several microtips 2, for example 16, are located in each cell 12 defined by the cathode conductors 13 (FIG. 2B). The intersection of a row 14 of grid 3 with a column 15 of cathode 1 correspond here, for example, to 64 cells 12 of a cathode pixel (FIG. 2A).

Cathode 1 is generally comprised of layers successively deposited on glass substrate 10. FIGS. 2C and 2D partially show a sectional view along line 2C—2C of FIG. 2B. A conductive layer 13, for example comprised of niobium, is deposited on substrate 10. This layer 13 is patterned with columns 15, each column being provided with cells 12 surrounded by cathode conductors 13. A resistive layer 11 is then deposited on these cathode conductors 13. This resistive layer 11, comprised for example of amorphous silicon doped with phosphor, serves to protect each microtip against an excessive start-up current. The adjunction of such a resistive layer 11 serves to homogenize the electronic emission of the microtips 2 of a pixel of cathode 1 and thus to increase the life time. An insulating layer 16, for example silicon oxide ($SiO_2$), is deposited on the resistive layer 11 for insulating the cathode conductors 13 from grid 3 (FIG. 2D). Grid 3 is comprised of a conductive layer, for example of niobium. Holes 4 and wells 17 are respectively created in layers 3 and 16 for receiving the microtips 2 which are for example in molybdenum.

The realization of cathode 1 with microtips 2 thus requires the creation of circular holes 4 and of cylindrical wells 17 in grid 3 and in the insulating layer 16. The creation of these holes 4 and wells 17 is achieved by photolithographic circle patterning. A photoresist is applied on grid layer 3 and is irradiated after being partially masked for determining the positions of holes 4 and thus of the microtips 2.

Conventionally, the diameter of a well 17 is comprised between 1 and 2 µm, the pitch being around 2 to 10 µm, and the number of microtips is of several thousands for each pixel of the screen.

Because of these dimensional constraints, the existing photolithographic methods limit the surface area of the flat screens.

SUMMARY OF THE INVENTION

An object of the invention is to overcome the drawbacks of the current techniques by proposing a photolithographic circle patterning method which allows obtaining a regular diameter of the circles and a regular resolution or density of the pattern, and this independently of the surface area of the layer to pattern.

To achieve this object, the present invention provides a photolithographic method for patterning small diameter circles at a high resolution on a layer, comprising the steps of depositing a resist layer on said layer; depositing calibrated microspheres, opaque to a radiation, on the surface of the resist layer; and irradiating said resist layer with said radiation.

According to an embodiment of the invention, the microspheres have a predetermined diameter ranging between 1 and 5 µm.

According to an embodiment of the invention, the irradiation step is carried out with a beam of quasi parallel ultraviolet radiation.

According to an embodiment of the invention, the step of depositing microspheres comprises spraying, on the resist layer, a alcohol based solvent in which the microspheres have been previously mixed.

According to an embodiment of the invention, the step of depositing microspheres comprises immersing the resist layer in a bath containing a suspension of the microspheres, and letting the microspheres deposit on the resist layer by gravity.

According to an embodiment of the invention, the step of irradiating is carried out with a source of a beam substantially parallel to a given axis, and the resist layer is placed at a predetermined angle α with respect to this axis about which it is rotated.

According to an embodiment of the invention, the method comprises, previous to the step of depositing microspheres, a pre-irradiation step of the resist layer, by masking predetermined areas in which the circles should be patterned.

The invention also addresses the use of such a photolithographic method for patterning circles in the production of a cathode of a microtip screen, wherein the resist layer is applied on a stack of layers successively comprising on a substrate, a layer of cathode conductors organized in columns provided with cells, a resistive layer, an insulating layer, and a grid conducting layer, and wherein the circles define on the grid and insulating layers, locations for holes and wells for receiving microtips.

According to an embodiment of the invention, a pre-irradiation step of the resist layer is carried out previous to the step of depositing microspheres, by masking the areas at most equivalent to the cells defined by the cathode conductors.

BRIEF DESCRIPTION OF THE FIGURES

The foregoing and other objects, features and advantages of the present invention will be exposed in detail in the following exemplary non limiting description of preferred embodiments, by referring to the attached figures, among which.

The figures are not represented to scale for clarity.

DESCRIPTION OF PREFERRED EMBODIMENTS

According to an aspect of the present invention, it has been noted that, when a photolithographic circle patterning method of the type of the invention is used, it is important for the circles of the pattern to be of regular dimensions. In contrast, it is frequently unnecessary that the circles be equally spaced from each other, provided that the average resolution of the pattern is constant.

Figure 3A:
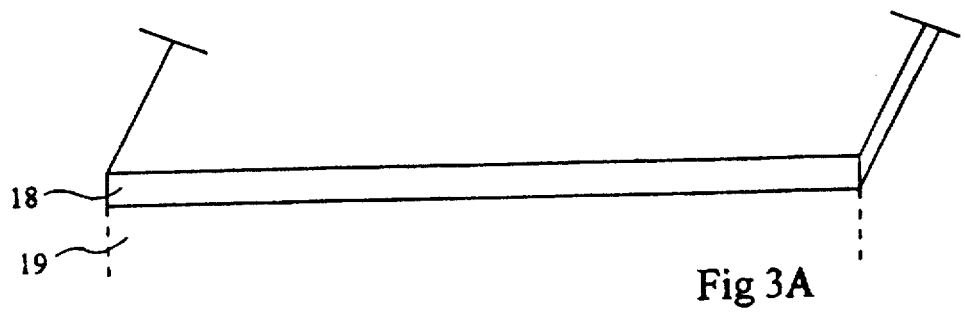
FIGS. 3A to 3D schematically show a layer to pattern and different steps of the photolithographic patterning method according to an embodiment of the invention.

In a first step of an exemplary method according to the invention, as shown in FIG. 3A, a layer of photoresist 18 of negative type is applied on a layer 19 to pattern.

In a second step (FIG. 3B), microspheres 20 are deposited on the resist layer 18. These microspheres 20 are, for example, glass or plastic microspheres. They are opaque to the irradiation in order to obtain a maximum masking effect of the zones on which they are deposited. The distribution of the microspheres 20 on the resist layer 18 is random. The invention more particularly applies to a photolithographic circle patterning method wherein regularity of the diameter and of the resolution of the circles in the whole layer is desired.

Thus, for masking the locations of the circles on the resist layer 18, microspheres 20 of small diameter are used, the diameter being regular from one microsphere to the other and of a given value, for example, ranging from 1 to 2 μm with a tolerance better than 10%.

As seen above, the distribution of the microspheres 20 is random. It is however important to ensure that the density of the deposited microspheres 20 on layer 18 is sufficient and regular. To do so, according to the invention, several methods for depositing microspheres 20 can be used and will be described later in relation with FIGS. 5 and 6.

Figure 3B:
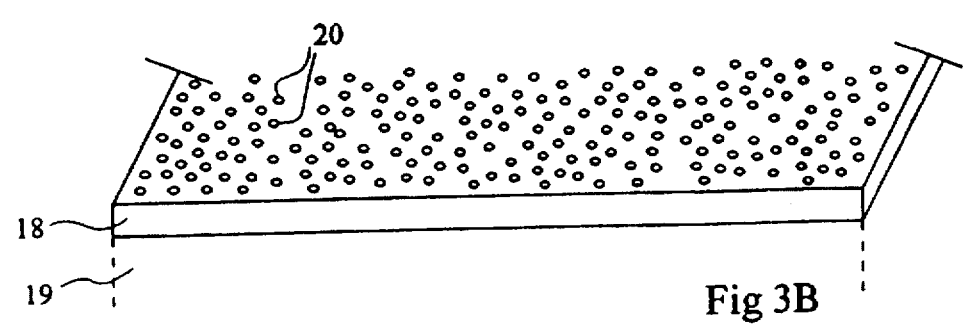
Figure 3C:
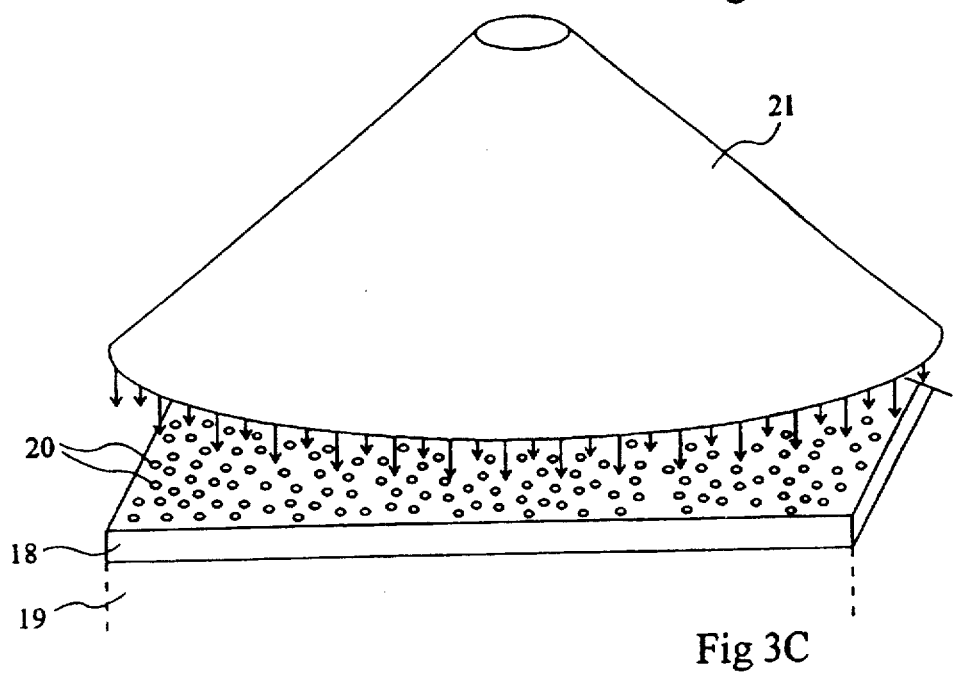

Once the microspheres 20 have been deposited on the resist layer 18, this resist layer 18 is irradiated by a source 21 of quasi parallel light during a third step (FIG. 3C). The wave length of the radiation of source 21 is chosen as a function of the used resist and the desired accuracy, for example in the ultraviolet range. The microspheres 20 are thereafter evacuated from the resist layer 18 during a fourth step (not represented).

During a fifth step (FIG. 3D), the resist is developed by using a conventional method under conditions which are compatible with the type of resist used. Circles 22 are thus formed on the resist layer 18 at the locations of the microspheres 20, and are subsequently used for etching a corresponding pattern in layer 19.

Figure 4A:
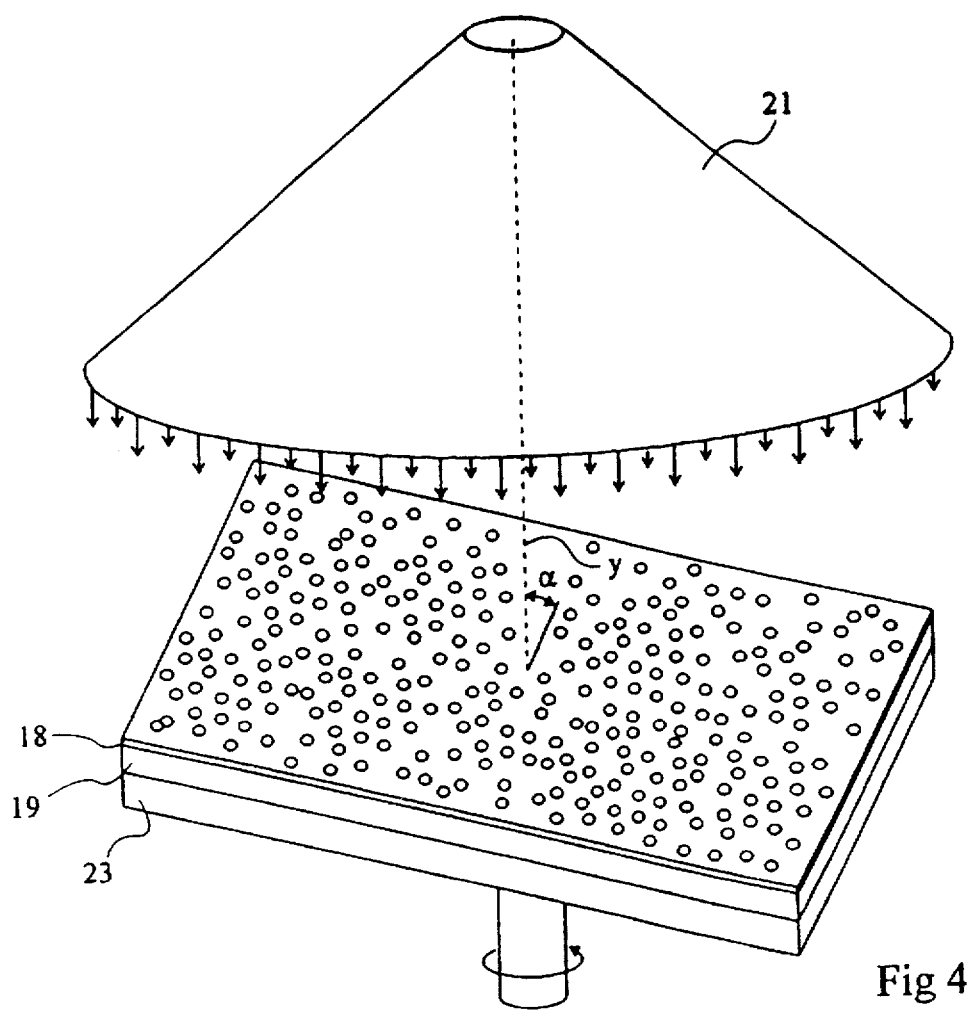
FIGS. 4A and 4B illustrate an alternate irradiation step of the method according to the invention.
Figure 4B:
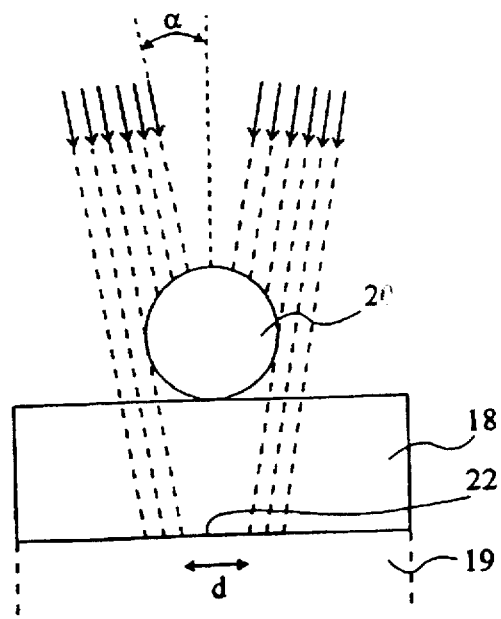

An alternative of the irradiation step (third step) is illustrated in FIGS. 4A and 4B. This alternative consists in irradiating the resist layer 18, still by a source 21 of quasi parallel light, but having tilted layer 18 with respect to the axis Y of the beam and by turning it about the axis Y. To do so, the layer to pattern 19, provided with the resist layer 18 on which the microspheres 20 have been deposited, is placed on a rotating support 23 tilted by a given angle a with respect to the axis Y of the beam.

Hereby, as shown in FIG. 4B, the diameter d effectively irradiated under each microsphere 20 is smaller than the diameter of the microspheres 20. The circles 22 are thus obtained with a diameter d smaller than the diameter of the microspheres 20. The ratio between the diameter of the microspheres 20 and the diameter d of the obtained circles 22 depends on the tilting angle α of support 23 with respect to the axis Y of the beam of quasi parallel radiation of source 21. This alternative further improves the obtained resolution in using the method according to the invention. Indeed, microspheres 20 of bigger size can be used, which will have a better uniformity between each other. For example, circles 22 of 2 μm in diameter can be realized with microspheres 20 of 5 μm in diameter.

Figure 5:
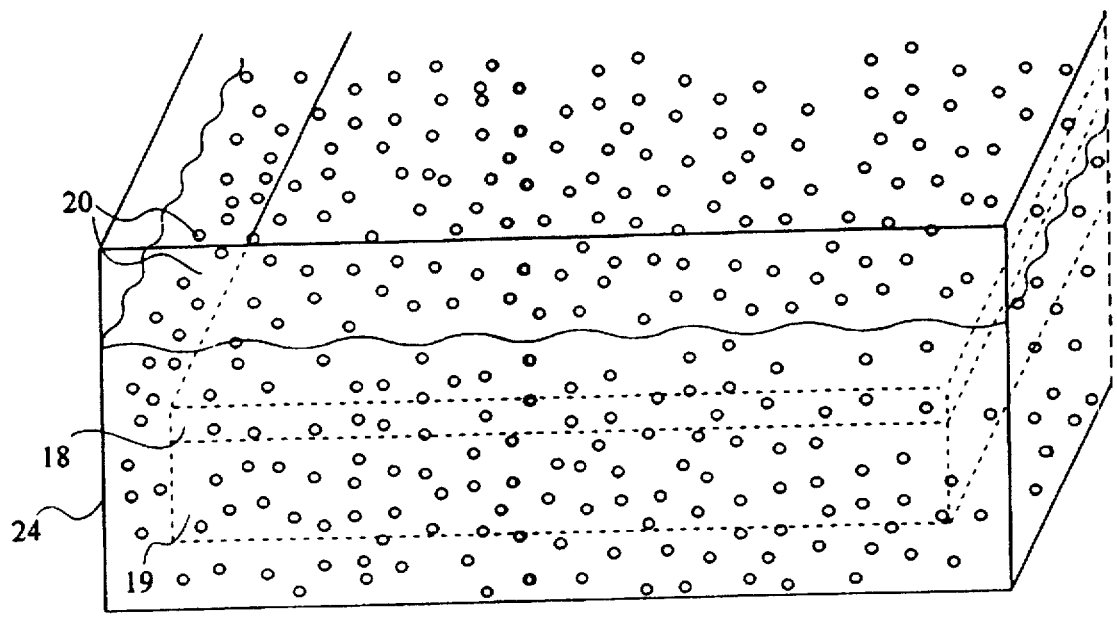
FIG. 5 illustrates an exemplary step of depositing microspheres of the method according to the invention.
Figure 6:
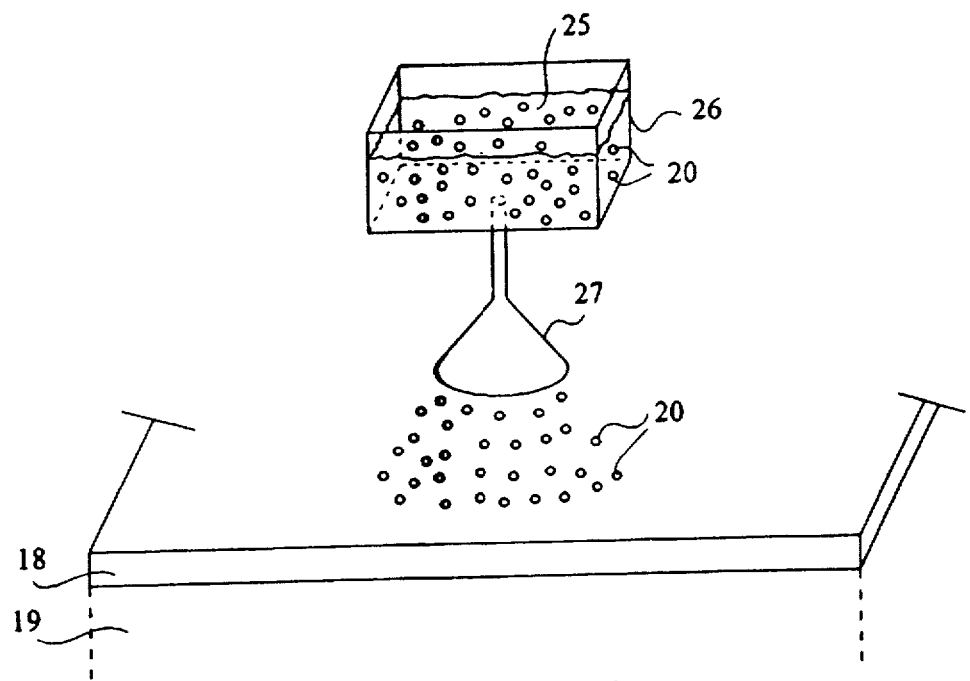
FIG. 6 illustrates an alternate step of depositing microspheres of the method according to the invention.

In relation with FIGS. 5 and 6, methods which can be used to deposit the microspheres 20 on the resist layer 18, randomly and at a high resolution, will be described.

A first method (FIG. 5) consists in immersing the layer to etch 19, provided with the resist layer 18, in a bath 24 containing the microspheres 20 in suspension. The concentration of the microspheres 20 in the bath is fixed as a function of the desired resolution of the circles 22. The depositing of the microspheres 20 is achieved by decantation, the microspheres being glass in this case. It is moreover possible to achieve the irradiation step through the bath 24 as soon as the microspheres 20 have decanted, which accelerates the execution of the method. The evacuation of the microspheres 20 after irradiation, is here simply achieved by extracting the layer to pattern 19 and its eventual support from bath 24.

A second method (FIG. 6) consists in spraying, on the resist layer 18, a mixture of a solvent 25 and of microspheres 20, contained in a tank 26. The solvent 25 is alcohol based, which allows its evaporation during the spraying. The distribution of the microspheres 20 on the resist layer 18 has a good homogeneity, the density of the microspheres 20 being determined by the spraying time. Here, the microspheres 20 adhere to the resist layer 18 by electrostatic effect, resulting from charges acquired during their travel through the air between the nozzle 27 of the spraying device and the resist layer 18. The evacuation of the microspheres 20 after the irradiation can be achieved by blowing or any other means. An advantage of this technique is that a repulsive force is created between the microspheres, due to their charges, which tends to improve the regularity of their distribution.

Another alternative (not represented) of the invention consists in embedding the microspheres 20 in a viscous material, for example in polyvinylalcohol. The resist layer 18 is covered by a layer of this material, for example, by scraping or serigraphy without pattern. The polyvinylalcohol is then dried and the resist layer is irradiated in the manner described above. Finally, the polyvinylalcohol is dissolved, for example in water, and the microspheres 20 are at the same time evacuated.

Figure 7A:
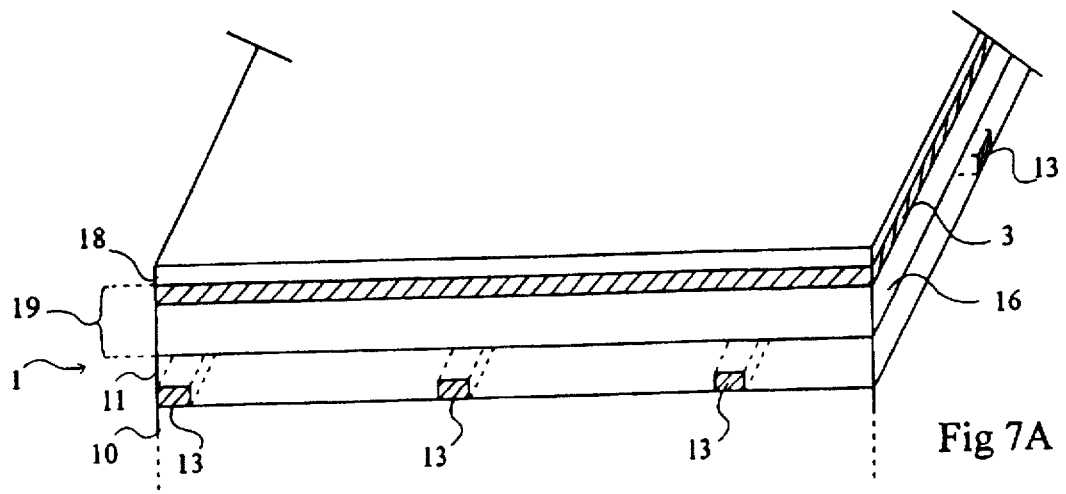
FIGS. 7A to 7C show an application example of the method according to the invention to a microtip cathode.
Figure 7B:
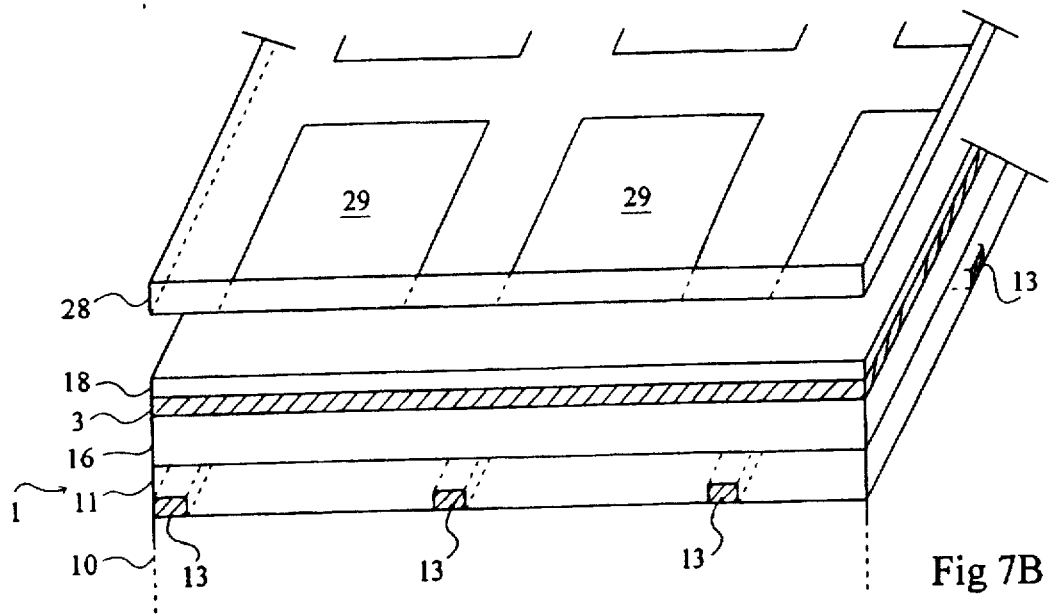
Figure 7C:
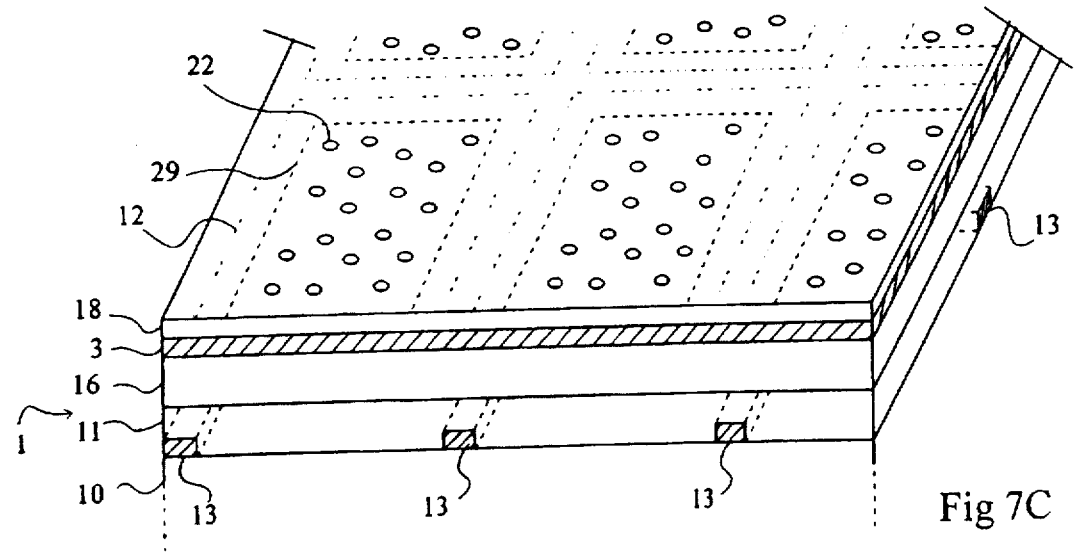

FIGS. 7A to 7C illustrate an application example of the method described above to achieve a circle pattern defining the locations of the microtips in a microtip cathode of a flat display screen.

FIG. 7A shows the different layers provided in a microtip cathode 1 before carrying out the photolithographic patterning method according to the invention. As already described in relation with FIGS. 2A to 2D, a conducting layer, for example based on niobium, is deposited on a substrate 10. This conducting layer is etched to define cathode conductors 13. These conductors 13 are organized in columns provided with cells 12, each cell 12 defining a region for receiving microtips 2, and each column having a width corresponding to that of a pixel. A resistive layer 11 is thereafter deposited on the cathode conductors 13. Then an insulating layer 16, for example comprised of silicon oxide ($SiO_2$), is deposited, which insulates the cathode conductors 13 from a grid layer 3, for example based on niobium, which constitutes the last layer.

The layer 19 to pattern by carrying out the method according to the invention, is here comprised of both the grid layer 3 and the insulating layer 16 in which it is desired to form holes 4 and cylindrical wells 17 for receiving the microtips 2.

The use of the photolithographic patterning method according to the invention is possible due to the fact that the quality of the screen depends on the density regularity of the microtips 2 from one pixel to the other and on the diameter regularity of the microtips 2. In contrast, the distance between two microtips 2 has no influence on the quality of the screen provided that the density of the microtips is high. Thus, the random distribution of the circles 22 on layer 19 has no consequence on the quality of the screen. It has thus been observed that a good quality flat screen was obtained with a number and a diameter of the circles 22 in each pixel of the screen remaining the same with a tolerance of 5%, the density of the circles 22 of a pixel being high to not reduce the brightness of the screen. This result is achieved by depositing calibrated microspheres 20 of a given diameter ranging between 1 and 5 µm with a tolerance of 10% for the diameters of the microspheres 20.

Figure 1:
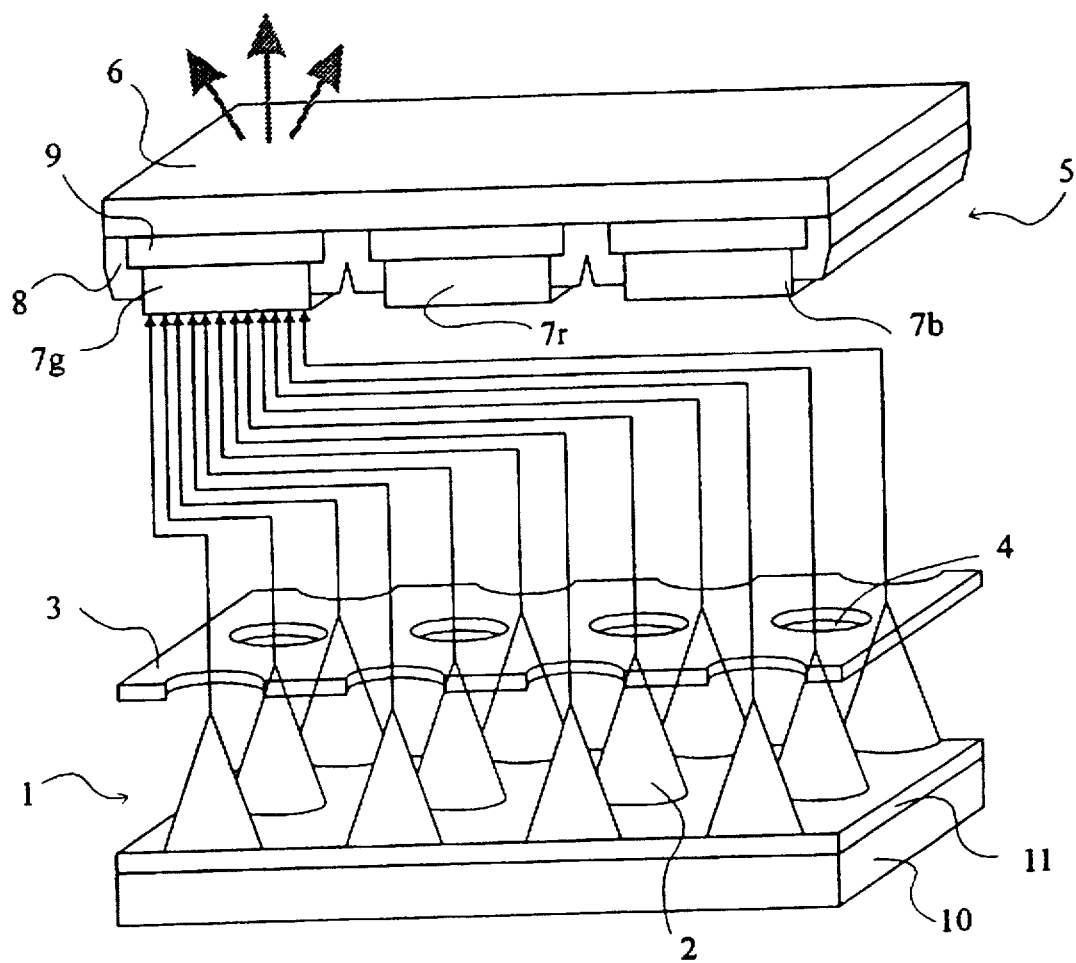
FIGS. 1 and 2A to 2D, above described, are intended to expose the state of the art and the problem encountered in the particular application of the present invention.
Figures 2A, 2B:
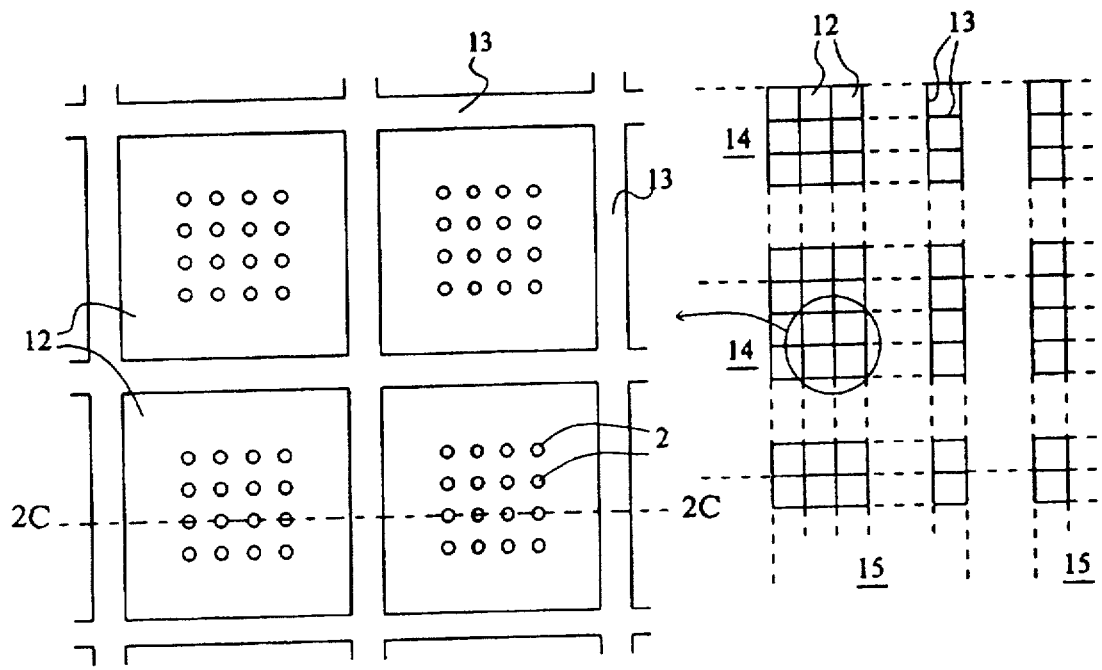
Figure 2C:
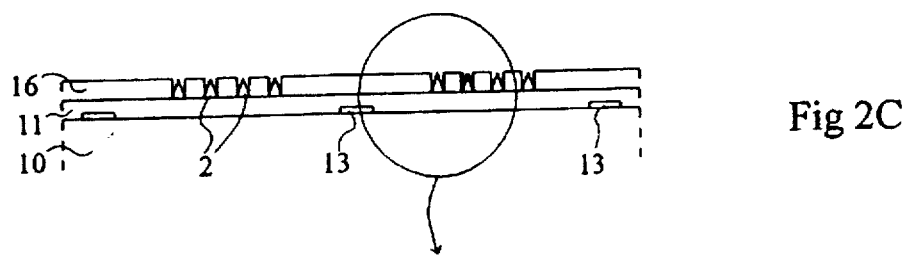
Figure 2D:
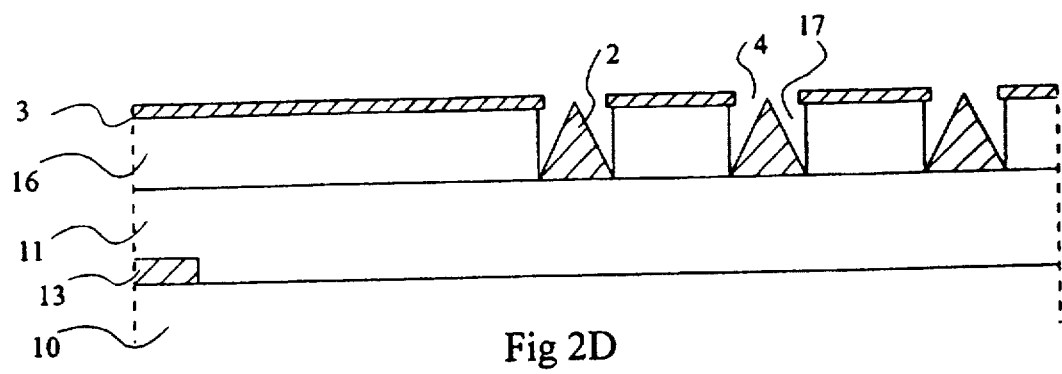

In contrast, it is preferable to respect the spacing between the groups of microtips 2 of two adjacent cells 12, that is, the intervals without microtips 2 under the cathode conductors 13 (see FIGS. 2B to 2D).

To do so, an alternative of the method according to the invention is carried out. This alternative consists in realizing a double irradiation of the resist layer 18 by achieving a pre-irradiation step before depositing the microspheres 20.

Figure 3D:
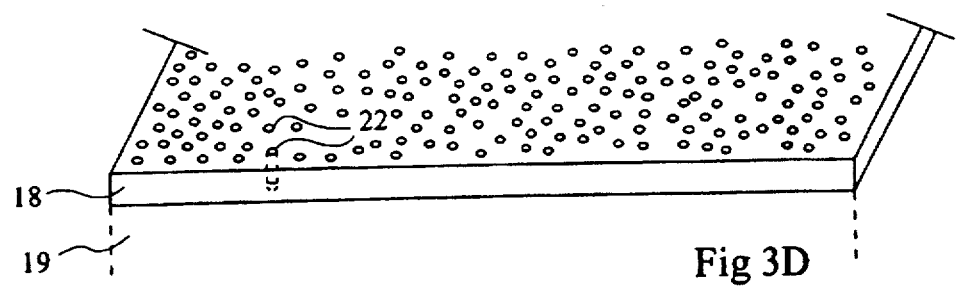

During this intermediate step (FIG. 7B), the resist layer 18 is pre-irradiated through a conventional mask 28 for masking the surfaces 29 contained within the cells 12 defined by the cathode conductors 13. The use of a conventional mask 28 is here satisfactory provided that the intervals between the groups of microtips 2 represent a sufficient distance (about 10 to 20 µm) corresponding to the resolution of this type of mask, the cells 12 being devoid of microtips 2 at their periphery. Moreover, this distance allows a certain tolerance to be accepted on mask 28. The execution of the method such as described in relation with FIGS. 3B to 3D is then carried out. During the second step (FIG. 3B), the microspheres 20 are deposited by any of the methods previously described in relation with FIGS. 5 and 6. The irradiation in the third step (FIG. 3C or 4A) is then achieved. This irradiation is only efficient in the surfaces 29 which were masked during the intermediate step of pre-irradiation, i.e. towards the center of cells 12. Thus, during the development of the resist by a conventional method (FIG. 7C), circles 22 are obtained on the resist layer 18 only in the central areas 29 of the cells 12. Carrying out such an alternative allows to position the microtip regions of the cathode 1 at the center of cells 12, by limiting the realization of circles 22 to regions 29 of the screen which correspond to regions that should receive microtips 2. During the pre-irradiation step, it is preferred to mask areas 29 which are smaller than the areas of cells 12. This is to preserve the homogeneity of the current circulating in the microtips 2 through the resistive layer 11, by avoiding the realization of circles 22 at the periphery of cells 12. In FIG. 7C, the limits of the cells 12, under the cathode conductors 13, have been represented in dash and dot lines, and those of the pre-irradiated areas 29 have been represented in dotted lines.

Subsequently, the realization of holes 4 and wells 17 in the conducting grid layer 3 and insulating layer 16 is achieved in a conventional manner, as indicated in the above cited state of the art document.

Of course, various alternatives and modifications of the present invention will appear to those skilled in the art. In particular, although the present description refers to an example for carrying out the method for realizing a microtip cathode, the method according to the invention can be carried out for realizing other elements in which a circle pattern is necessary in a photolithographic patterning method.

Similarly, the compositions of the different layers have been given as an example, the method according to the invention applies to any type of layer provided that its components are compatible with the steps of the method and the desired application. In particular, the ultraviolet radiation is adapted to a conventional photoresist of negative type sensitive to ultraviolet light. However, other types of radiation can be used as a function of the chosen resist.

We claim:

1. A photolithographic method for forming small diameter, dense and substantially identical circular patterns on a layer, comprising the steps of:

depositing a resist layer on said layer;

depositing calibrated microspheres that are opaque to radiation on said resist layer, wherein said calibrated microspheres are substantially identical in diameter; and irradiating said resist layer.

2. The photolithographic method according to claim 1, wherein said microspheres have a predetermined diameter ranging between 1 and 5 μm.

3. The photolithographic method according to claim 1, wherein said step of irradiating said resist layer uses a beam of substantially parallel ultraviolet radiation.

4. The photolithographic method according to claim 1, wherein said step of depositing calibrated microspheres includes spraying an alcohol based solvent in which said microspheres have been previously mixed on said resist layer.

5. The photolithographic method according to claim 1 wherein the step of depositing calibrated microspheres includes immersing said resist layer in a bath containing a suspension of said microspheres, wherein said microspheres deposit on said resist layer by gravity.

6. The photolithographic method according to claim 1, wherein the step of irradiating the resist layer is carried out with a source of irradiation that is substantially parallel to an axis, and wherein said resist layer is placed at a predetermined angle with respect to the axis about which said resist layer is rotated.

7. The photolithographic method according to claim 1, further including the step of pre-irradiating said resist layer previous to depositing said microspheres, wherein said step of pre-irradiating includes the step of masking predetermined areas in which circles should be patterned.

* * * * *